(12) United States Patent
Daly et al.

(10) Patent No.: US 6,203,387 B1
(45) Date of Patent: Mar. 20, 2001

(54) SOLDERABLE METALLIZED PLASTIC CONTACT

(75) Inventors: John Daly, Chicago; Robert Skepnek, Norridge, both of IL (US)

(73) Assignee: Stratos Lightwave, Inc., Chicago, IL (US)

(*) Notice: Subject to any disclaimer, the term of this patent is extended or adjusted under 35 U.S.C. 154(b) by 0 days.

(21) Appl. No.: 09/422,314

(22) Filed: Oct. 21, 1999

(51) Int. Cl.[7] .................................................. H01R 9/24
(52) U.S. Cl. ................................................................ 439/886
(58) Field of Search ........................................ 439/637, 886, 439/884, 889, 636, 630, 33, 238, 403, 14.2, 180; 200/267, 268; 205/158; 427/301

(56) References Cited

U.S. PATENT DOCUMENTS

| | | | |
|---|---|---|---|
| 4,503,131 | * 3/1985 | Baudrand | 428/672 |
| 5,599,595 | 2/1997 | McGinley et al. | 428/33 |
| 5,688,146 | 11/1997 | McGinley et al. | 439/637 |
| 5,962,073 | * 10/1999 | Timmer | 427/301 |
| 6,074,228 | * 6/2000 | Berg et al. | 439/180 |

OTHER PUBLICATIONS

The SFF Committee, "Gigabit Interface Converter (GBIC)," Revision 5.1a, Jan. 12, 1999.

* cited by examiner

Primary Examiner—Renee Luebke
Assistant Examiner—Phoungchi Nguyen
(74) Attorney, Agent, or Firm—Karl D. Kovach; David L. Newman (57) ABSTRACT

A solderable metallized plastic contact includes an element made of a polymer where an electrically conductive material covers a surface of the element so as to form an electrically conductive region on the element. The electrically conductive material is electroplated to the surface of the element. The electrically conductive material in the electrically conductive region is solderable. The electrically conductive material in the electrically conductive region does not delaminate from the surface of the element. Additionally, a method of manufacturing a solderable metallized plastic contact is also disclosed.

7 Claims, 13 Drawing Sheets

SOLDERABLE METALLIZED PLASTIC CONTACT

BACKGROUND OF THE INVENTION

1. Field of the Invention

This invention concerns conductive coatings used, generally, in the electronics industry. The invention more particularly concerns an electrically conductive, electroplated, material covering a surface of a polymer element, where the electroplated material does not delaminate from the surface of the polymer element after subsequent high temperature soldering.

2. Discussion of the Background

Conductive coatings are well-known in the art which are also known as conductive inks. Conductive inks have many favorable characteristics, in that the compositions may include metals such as silver, copper, lead or tin to provide electrical conductivity. The conductive inks also may include adhesives such as polymeric binders which provide for solderability and adhesion strength. Conductive inks have been used for many applications, including applying conductive traces to printed circuit boards. The related art shows the application of conductive ink by silk screen printing onto a non-moldable insulating baseboard substances, such as FR4 or glass epoxy.

Polymers, which are commonly referred to as plastics, are known in the art which have characteristics, including high mechanical strength, durability, toughness, chemical resistance and high temperature performance. Liquid crystal polymers (LCPs) offer these characteristics, while providing the advantage of all moldable plastics. LCPs are able to withstand temperatures as high as 520° fahrenheit before deforming. It is an object of the present invention to combine the high temperature and moldable properties of plastics such as LCP with the quick and convenient process of printing with conductive inks.

Other applications require an overall coating of conductive material around an object. Typically, the object is made of a polymer so as to be injection moldable. One quick way of applying an overall coating is by way of an electroplating process. Such a solution was achieved in the automotive industry with the introduction of metallized plastics such as acrylanitrile butadiene styrene (ABS) which is a plastic material having an outer coating of a metal alloy. The metal coating typically includes a base coating of a copper alloy, with a second layer of a nickel alloy covering the copper alloy layer, and a third layer of a chrome alloy covering the nickel alloy layer. The use of metallized plastics in applications such as automotive bumpers and automotive interior compartment decorative trim elements works well for the intended purpose.

Recently, attempts have been made to solder a metallized plastic part to a printed circuit board so as to make electrical contact between the printed circuit board and the electrically conductive coating of the metallized plastic part. The result being that the two components were soldered together. However, the electrically conductive material covering the plastic part delaminated or blistered away from the surface of the plastic part. Such delamination is not acceptable in the electronics industry since the bond between the two components is not adequate. The bond between the two components is subject to tearing and thus subject to loss of electrical continuity between the two components.

Therefore, there is a need for a metallized plastic part which is solderable and which does not delaminate.

SUMMARY OF THE INVENTION

It is an object of the invention to provide a metallized plastic part where the electrically conductive coating does not delaminate from the surface of the plastic part after being soldered.

It is a further object of the invention to provide conductive components which are easily and inexpensively manufactured.

It is another object of this invention to provide a metallized plastic part which is flexible and which does not delaminate after being soldered.

In one form of the invention the electrical connector includes a unitary, molded polymer connector body which is covered in select locations with a firmly-adherent, electrically conductive coating. The connector body includes a base portion and at least one projecting contact arm portion extending from a first end connected to the base portion to a second end spaced from the base portion. The contact arm portion having at least one contact surface defined thereon adjacent the free end thereof. The contact surface having an electrically conductive region thereon defined by the firmly-adherent, electrically conductive coating. The firmly-adherent, electrically conductive coating is solderable. The firmly-adherent, electrically conductive coating does not delaminate from the contact surface of the contact arm.

In another form of the invention a conductive element includes a substrate made of a polymer where an electrically conductive material covers a surface of the substrate so as to form an electrically conductive region on the substrate. The electrically conductive material is electroplated to the surface of the substrate. The electrically conductive material in the electrically conductive region is solderable. The electrically conductive material in the electricaly conductive region does not delaminate from the surface of the substrate.

In yet another form of the invention a an assembly is provided which includes a GBIC standard guide rail system which is electroplated with an electrically conductive material. The GBIC standard guide rail system includes latches. The GBIC standard guide rail system is made of a polymer. The electrically conductive material covering the latches is soldered to conductive traces found on a printed circuit board. The electrically conductive material covering the latches does not delaminate from the surface of the latches. However, other portions of the GBIC standard guide rail system can be soldered to the printed circuit board.

The invention further includes a process for plating an element which includes the first step of electroplating a surface of the element with an electrically condutive material, and the second step of soldering the electrically conductive material of the element to an electrically conductive body so as to make an electrical connection between the element and the body. The electrically conductive material electroplated to the surface of the element does not delaminate from the surface of the element after the step of soldering.

The invention still yet includes a process for plating a GBIC standard guide rail system which includes the first step of electroplating a surface of the GBIC standard guide rail system with an electrically conductive material, and the second step of soldering the electrically conductive material of the GBIC standard guide rail system to an electrically conductive body so as to make an electrical connection between the GBIC standard guide rail system and the body. The electrically conductive material electroplated to the surface of the GBIC standard guide rail system does not delaminate from the surface of the GBIC standard guide rail system after the step of soldering has been completed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PRESENTLY PREFERRED EMBODIMENTS

The present invention relates to a plastic contact that has an electrically conductive material covering its outer surface and which is solderable and upon soldering, the electrically conductive material does not delaminate from the surface of the plastic contact. The invention can be better understood by reference to FIGS. 1–18, which show various aspects of presently preferred embodiments of this invention, wherein like reference numerals designate identical or corresponding parts throughout the several views.

Figure 1:
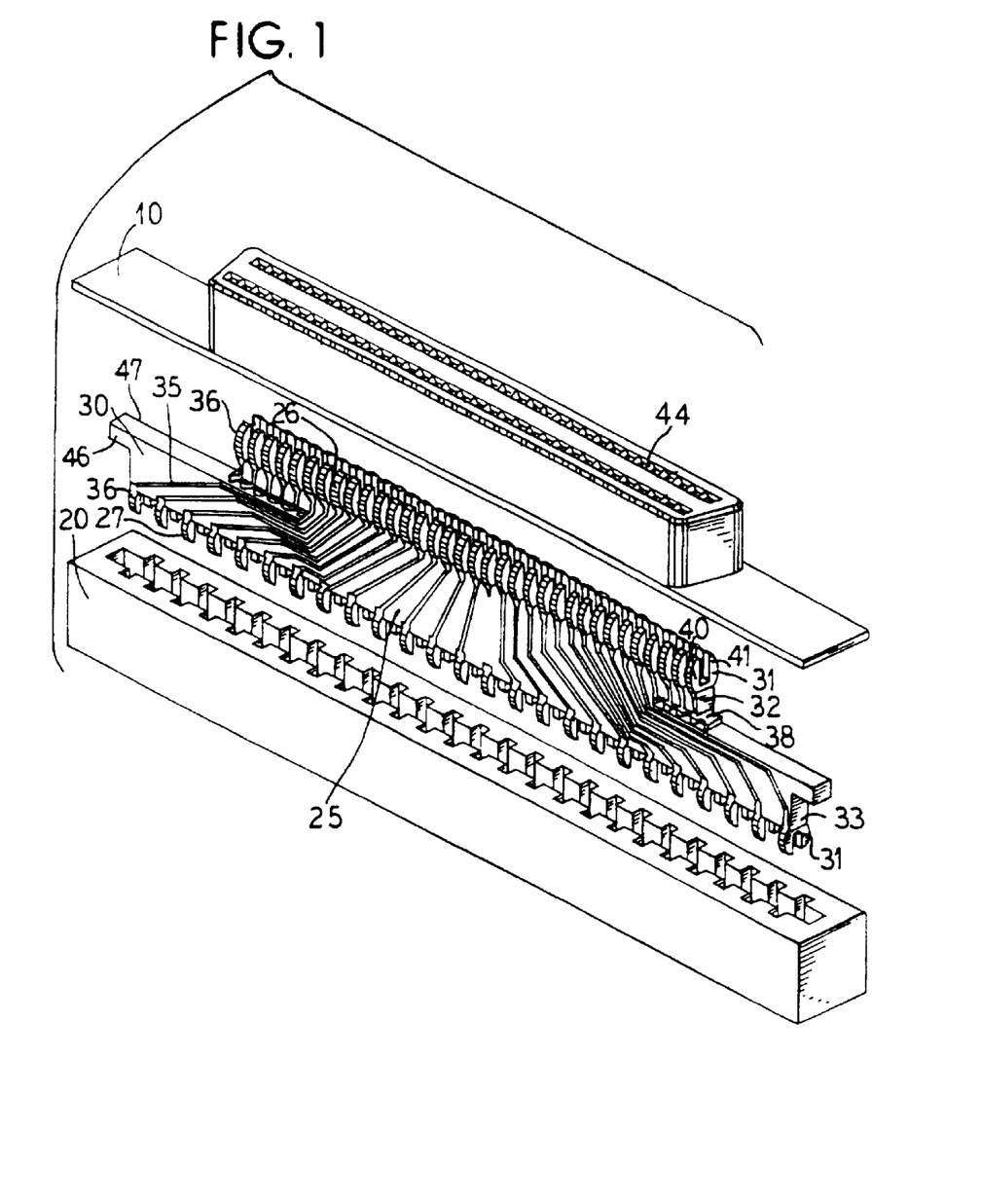
FIG. 1 is a is a perspective view of a new and improved female by female electrical connector circuit.

Turning to FIG. 1, an electrical connector circuit is shown having a top connector side 10, a bottom connector side 20 and a molded circuit 30. The molded circuit 30 provides a female-by-female convertor. The top connector side 10 is a high density 68-position connector. The bottom connector side 20 is a low density 50-position connector. The molded circuit 30 acts as a convertor between the 68-position top connector side 10 and the 50-position bottom connector side 20. The molded circuit 30 includes a circuitized area 25 in which electrical traces 35 are adhered. In an alternative embodiment the circuitized area 25 could also contain active or passive devices adhered thereto, such as resistors or integrated circuits. The molded circuit also includes terminal points 26, 27 at the end of the traces which expose the traces so that the electrical signals can be carried to or from an external source such as a male connector contact in the case of this particular embodiment. The molding shape of the circuit 30 provides for the terminal points 26, 27 of this embodiment to be coincident with the contacts 31. Contacts 31 are integrally molded with the molded circuit 30. The contacts 31 are adjacently molded to form a top comb of contacts 32 and a bottom comb of contacts 33. The molded circuit 30 includes traces 35 of printed conductive solderable ink.

By using the conductive ink to print traces, a new connector may be easily designed simply by changing the drawing and imaging of the trace design and re-screening on the same molded circuit, instead of having to re-mold the entire circuit. Conductive ink may be adhered to the substrate using the methods shown in the examples below. Any conductive ink may be used which is of suitable viscosity to enable the conductive ink to be adhered to the substrate via screen printing, brush, roller, spraying, dipping, masking, vacuum plating, vacuum deposition or any combination of the foregoing and then cured by heat oven, vapor phase oven or IR light to form a continuous electrical pathway. The conductive inks include copper or silver based compositions having silver oxide or tin and lead alloy binding compositions. Other conductive ink compositions which provide solderability and conductivity are also included. In an alternate embodiment, electroplating may be used in place of conductive inks to form traces and provide conductive surfaces on molded contacts.

The electrical connector circuit is assembled by inserting molded circuit 30 into bottom connector side 20 and covering top comb 32 with top connector side 10. The same ink which is printed to form traces 35 also cover the outer surface 36 of contacts 31. The conductive contact surface 36 provides for electrical connection between first male contact members (see FIG. 9) which are inserted into the top contact side 10 and second male contact members which are inserted into bottom contact side 20. A capacitor 38 is inserted within the molded circuit. In an alternative embodiment capacitor 38 could be replaced with a communication bridge to provide contact between traces on both sides of circuit 30.

The molded circuit 30 is molded of a polyester liquid crystal polymer such as a Hoechst Celanese plastic, V-140 (VECTRA) or other polymers such as Amoco Polymers, Inc.'s AMODEL AS-1240 EP (a 40 percent mineral filled, impact-modified polyphthalamide (PPA) resin). A characteristic of LCP is that it has great strength while also allowing some resiliency which allows for the forming of miniature contacts 31. The contacts at the low density side, bottom comb 32, may be molded on 0.100 inch centers and at the high density side, top comb 32, on 0.050 inch centers. These contacts 31 have two ears 40, 41 which move toward one another upon insertion of a male contact member, frictionally engaging each of the side surfaces 36 of ears 40, 41 to provide retention of the male contact member inserted within passage 44 of the connector housing and also provide a constant electrical connection.

The conductive ink is cured at high temperatures onto the molded circuit 30 in order to adhere the conductive ink to the LCP to form traces 35 and contact surfaces 36. Such a process assures multiple cycles of insertion of connectors without disturbing the adherence of the conductive ink to the contact 31. As well, other techniques may be used to assure that the conductive ink is properly adhered, as well as to insure that there is sufficient conductivity between the female contacts 31 and the male contacts. Such conductivity may be improved by plating contacts 31. Such plating may be added to the conductive ink 36 using metals such as nickel-silver, gold, copper/nickel/gold, or tin-lead. Also, processes such as electroless or electrolytic may be used. In another embodiment, the conductive layers 35, 36 may be formed via electroplating.

This circuit 30 may also include dual wipe contacts with conductive ink 36 adhered to both sides of the circuit 30 so that ear 40 has conductive ink and ear 41 also has conductive ink adhered to its outer surface. The contact 30 has the unique ability to provide two functions or two separate signals on each side of the contact 40, 41. For example, ear 40 may provide a signal path to a ground and ear 41 may provide a signal path through a resistor to power.

Figure 2:
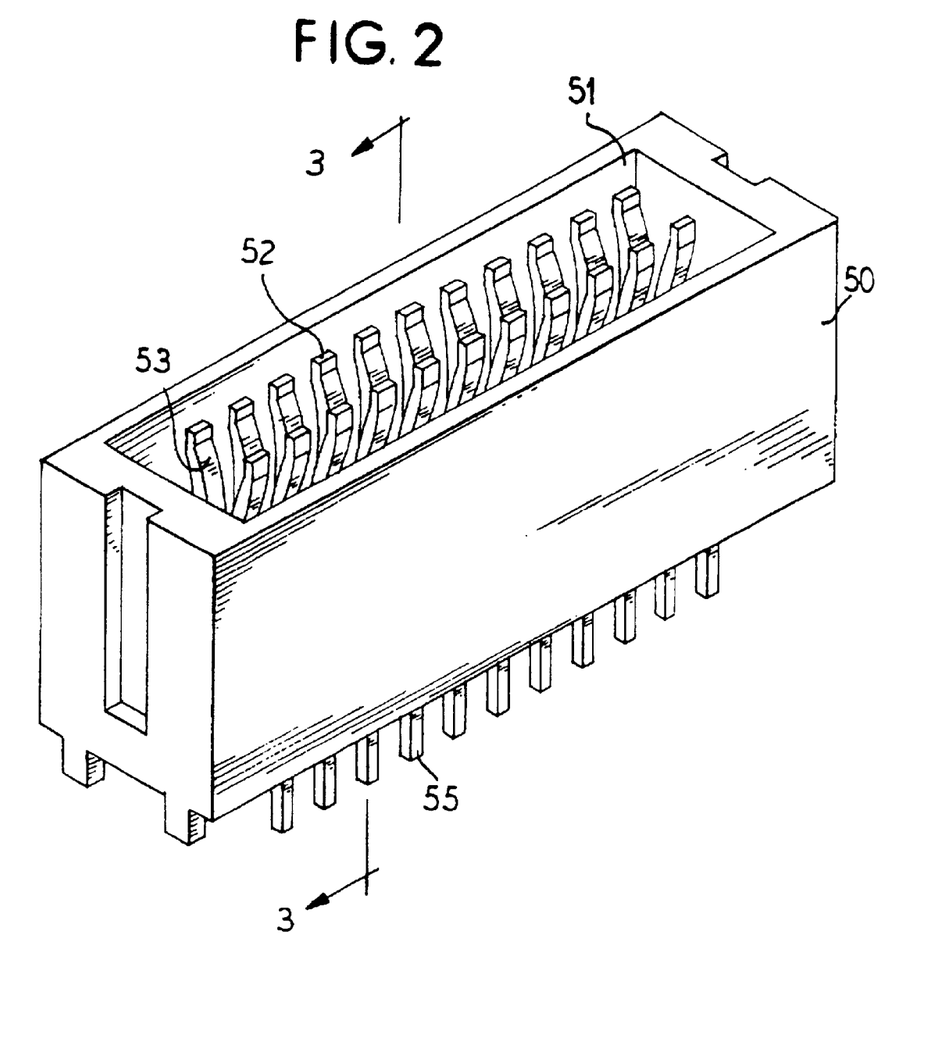
FIG. 2 is a perspective view of an electrical connector incorporating another component.

Turning to FIG. 2, another embodiment is shown. An electrical connector having a housing 50 having a top opening 51 and therein contacts 52. The contacts are arranged along the length of the housing 50 in opposing relationship. The contacts 52 are female contacts which receive male contacts therebetween. The male contact is inserted into the top 51 of the shell 50 and engage inner surfaces 53 of contacts 52. The inner surfaces 53 have a conductive coating adhered thereto (see FIG. 3). The contacts 52 have a contact tail 55 which also has a conductive coating. The contact tail may be mounted on a substrate such as by insertion into a printed circuit board. The contacts 52 are formed of molded plastic material such as LCP or AMODEL. The contact tail 55 may be plated in order that the tail 55 may be soldered within a through hole of a printed circuit board (see FIG. 15).

Figure 3:
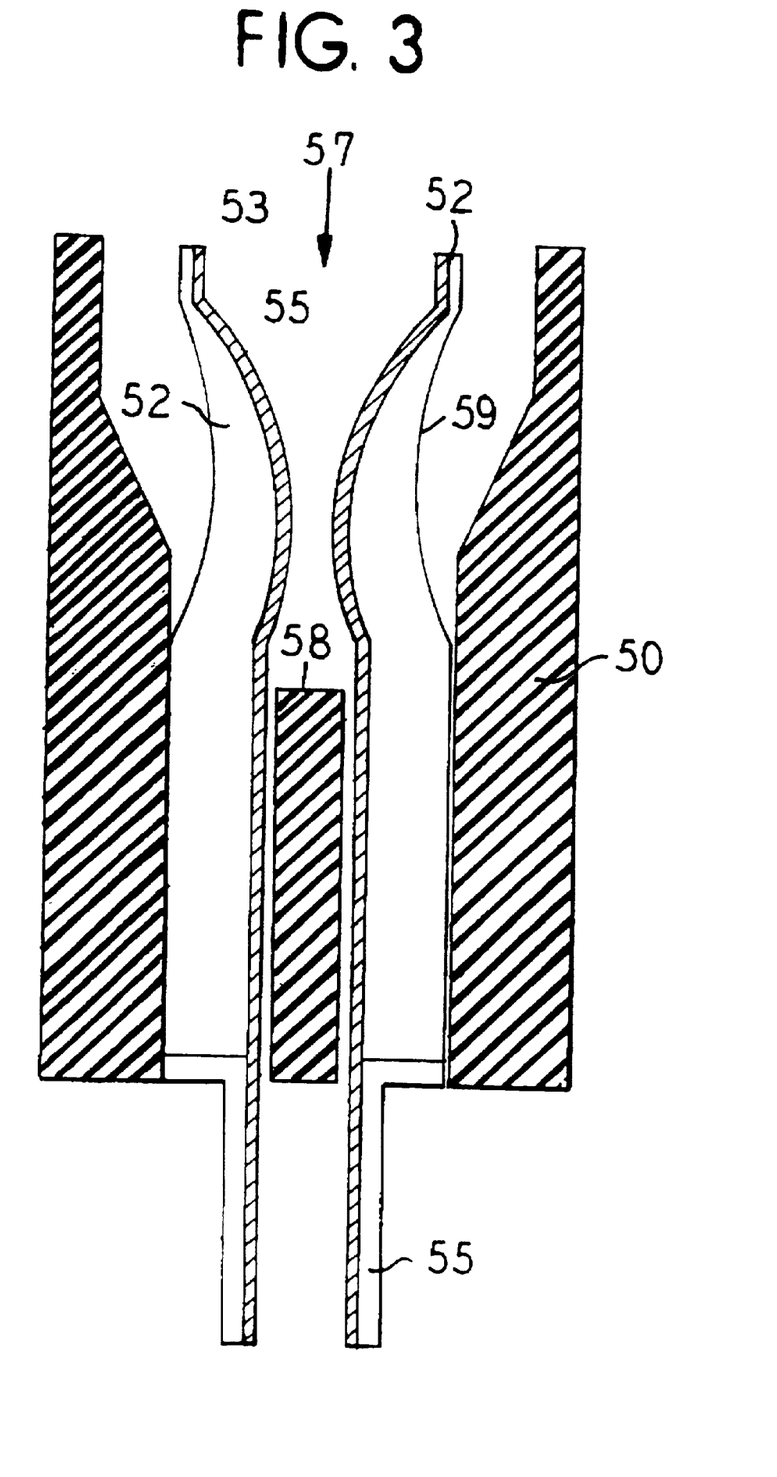
FIG. 3 is a cross-sectional side elevation view of FIG. 2 taken at line 3—3.

FIG. 3 shows a cross-sectional side elevation of FIG. 2 taken at line 3—3. The connector housing 50 and contacts 52 are formed of molded LCP. Contacts 52 have a conductive coating 55 adhered on the inner side 53. In an alternative embodiment, a conductive coating could also be adhered to an outer side of contacts 52. Such a dual-sided contact provides a dual function contact because the two traces of conductive coating are isolated from each other by the insulation of the contact 52. The use of dual function contacts allows for reduction in the number of contacts required for a specific application and the overall size of the connector housing such dual function contacts. For example, in a traditional SCSI (small computer standard interface) I device having traditional metal contacts each which may only carry a single signal, fifty (50) pairs of contacts are required having 0.100 inch spacing to provide a connector of overall length of at least 2.50 inches. Using the plastic molded dual function contacts of an alternative embodiment, only twenty-five (25) pairs of contacts are required, reducing the overall length of the connector to 1.75 inches.

A male contact may be inserted between contacts 52 from direction of arrow 57 to be inserted between contacts 52, 52 until it abuts bottom surface 58. The contacts 52, 52 are molded of a plastic material which provides some resiliency, so that upon insertion of a male member between contacts 52, 52 the upper portions 59 of contacts 52, 52 will spring backwards providing a frictional force between the male contact and the contacts 52, 52 and providing an electrical conductive connection therebetween. Contact tail 55 carries the electrical transmission from the top portion 59 of contacts 52, 52 to be connected to a substrate.

Figure 4:
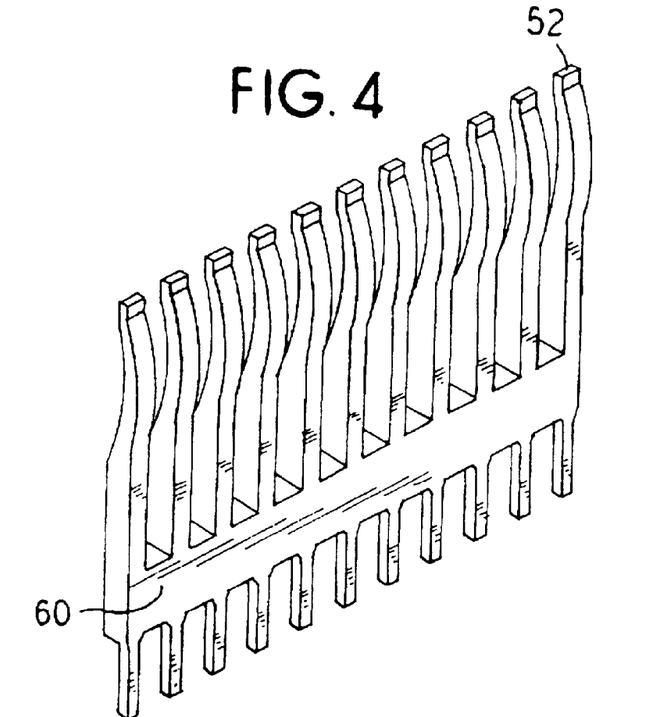
FIG. 4 is a perspective view of the contact elements of the electrical connector of FIG. 2, prior to adhesion of the conductive surface.
Figure 5:
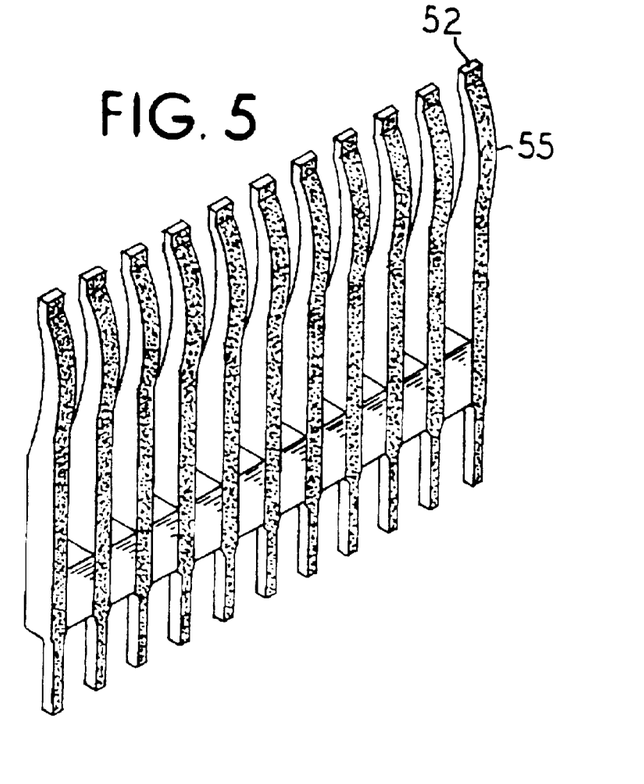
FIG. 5 is a perspective view of the contact elements of the electrical connector of FIG. 2, subsequent to adhesion of the conductive surface.

FIG. 4 is a perspective view of the contact elements of the electrical connector of FIG. 2. The contacts 52 are gang molded as multiple contacts joined along their base by a bar 60. The molding of contacts in such an orientation allows for the molding of multiple contacts in one shot and also allows for quick and easy insertion of multiple contacts in a uniform position within a connector housing 50. FIG. 4 shows the contacts prior to adherence of a conductive coating. FIG. 5 shows the same plastic contacts 52 of FIG. 4 having a conductive coating 55 adhered thereto. The adherence of the conductive coating can be accomplished by screen printing, spraying, dipping and masking, vacuum plating, vacuum deposition or by ink jet. Various conductive inks may be adhered according to the examples below to provide strong adherence characteristics so that the contacts 52 may withstand multiple cycles of swiping by male contacts. In an alternative embodiment, the plastic contacts 52 may be plated with metals such as gold or copper/nickel/gold to provide for the conductive coating.

Figure 6:
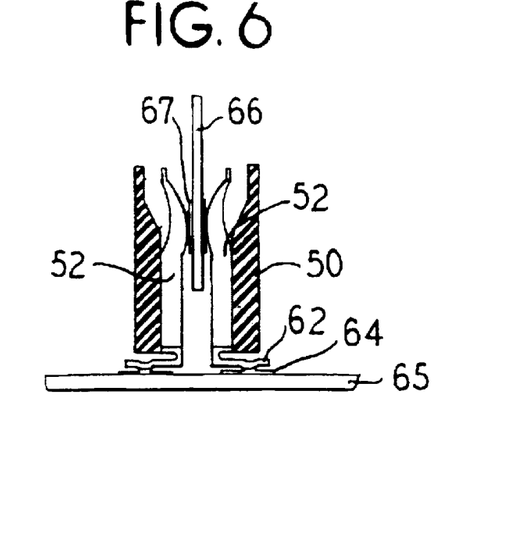
FIG. 6 is a side elevation view partly in section of the electrical connector of FIG. 2 showing an embodiment having surface mount construction.

The connector shown in FIG. 2 may provide the basis for many variations of connectors having varying mounting configurations such as FIG. 6 which shows contact tails 62 being bent outwardly at right angles under the housing 50 to allow for surface mounting of the connector on a substrate 65. A substrate 65 such as a printed circuit board may have pads 64 which upon activation, such as by a vapor phase oven, will bond to the conductive coating of contact tail 62. By using such high temperature polymers such as LCP or AMODEL, delamination or deformation of the metallized plastic will not occur during the reflow process. Male contact 66 having conductive surface 67 is shown inserted inbetween contacts 52, 52.

Figure 7:
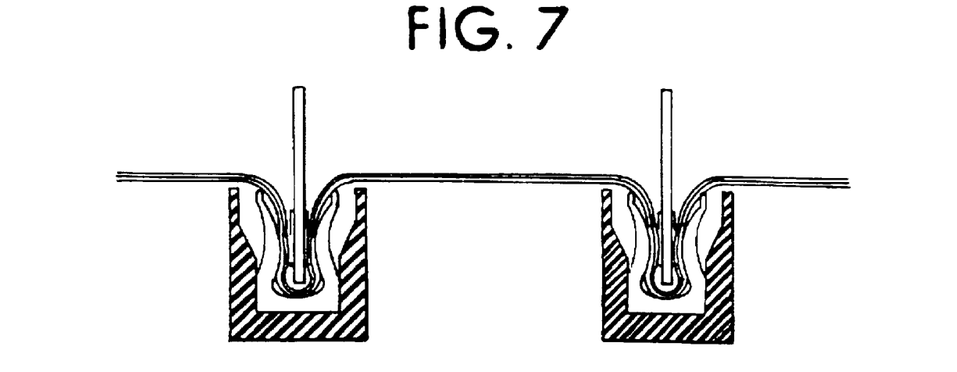
FIG. 7 is a side elevation view of the electrical connector of FIG. 2, partly in section showing a further embodiment as a daisy chain.

Another variation is shown in FIG. 7 showing a daisy chain connection between connectors.

Figure 8:
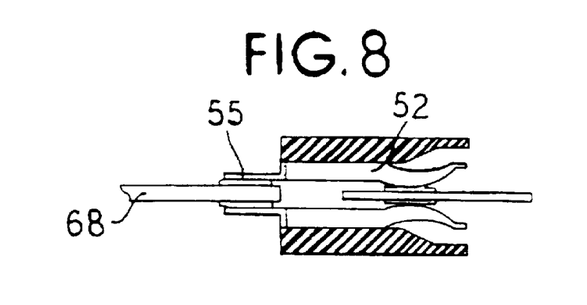
FIG. 8 is a side elevation view partly in section of the electrical connector of FIG. 2 showing an embodiment having an edge card attachment.

FIG. 8 shows a card edge connector wherein contacts 52 have contact tails 55 which are connected to the edge of a printed circuit board 68.

Figure 9:
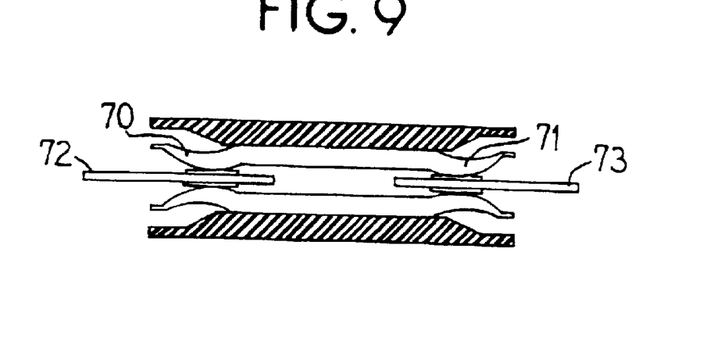
FIG. 9 is a side elevation view partly in section of the electrical connector of FIG. 2 having a double female embodiment.

FIG. 9 shows a double female connector having a connector with a first female end 70 and a second female end 71 which accepts a first male connector 72 and a second male connector 73 from the opposite end.

Figure 10:
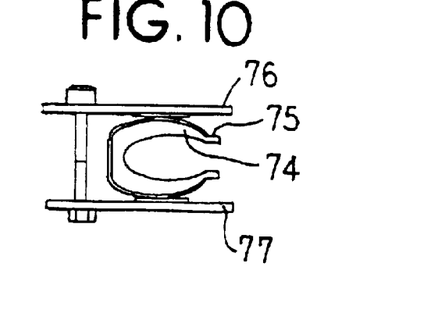
FIG. 10 is a side elevation view of the electrical connector of FIG. 2 having a surface mount—compression embodiment.

FIG. 10 shows a surface mount compression connector wherein the plastic contact 74 having a conductive coating 75 is compressed between two substrates 76, 77 providing a surface mount connection.

Figure 11:
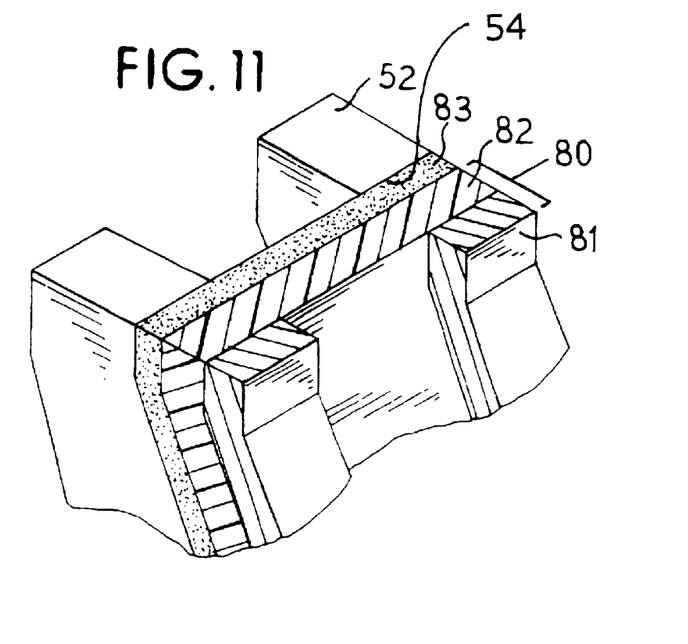
FIG. 11 is a perspective view of an alternative embodiment of the contact members of the electrical connector of FIG. 2.

FIG. 11 shows an alternative embodiment wherein the electrically conductive material or coating of the prior embodiments is replaced by the electrically conductive material or plating layers 80 which includes a first electroplated layer 83 of a metal such as copper, a second electroplated layer 82 of a metal such as nickel. The electroplated layers 82, 83 are applied to a surface 54 of the molded plastic connector 52 which has been shown throughout the prior embodiments. A third layer 81 may be applied to enhance conductance or durability such as gold, silver, or chromium.

Figure 12:
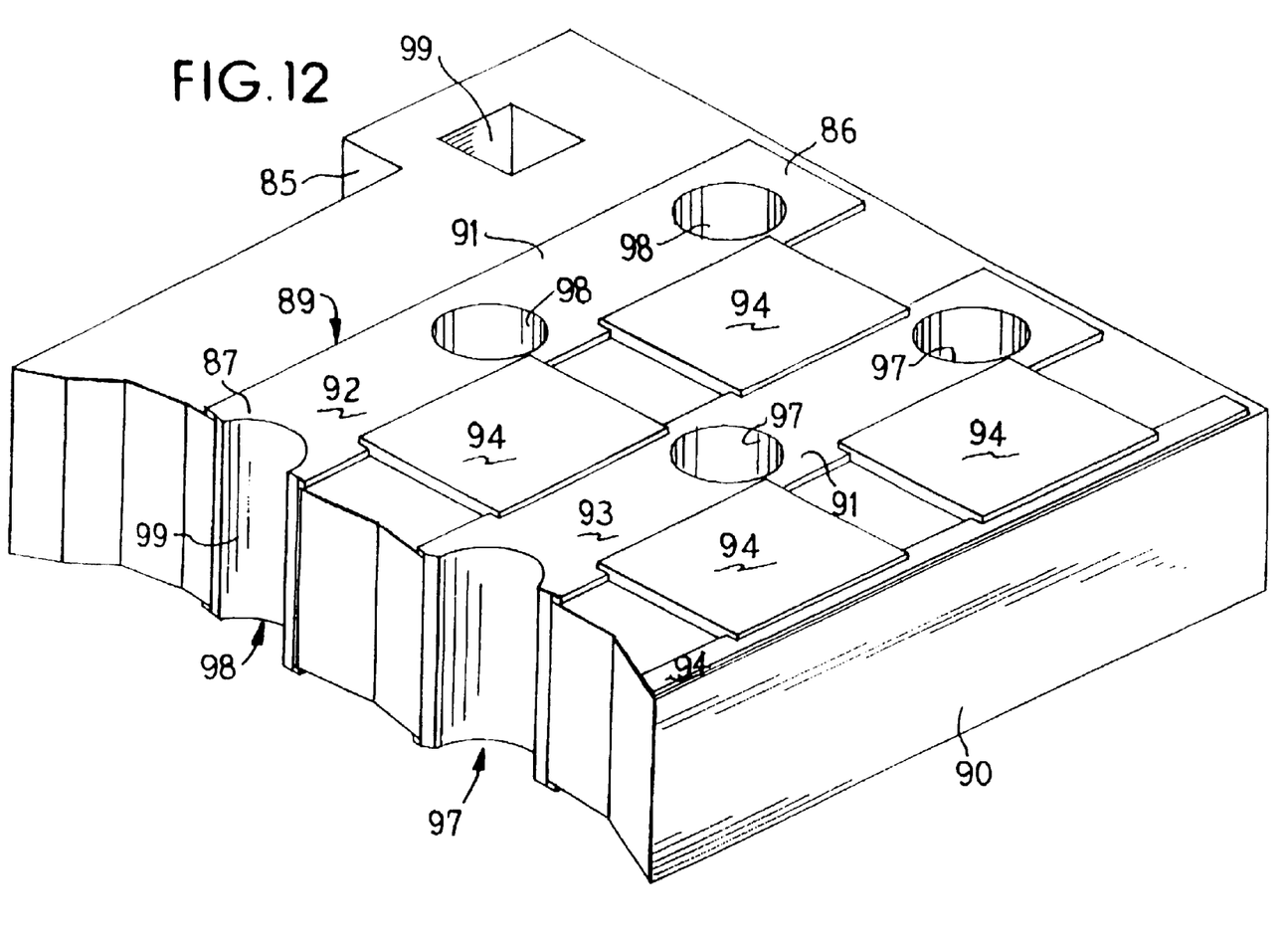
FIG. 12 is an enlarged fragmentary perspective view of a printed circuit board.

FIG. 12 shows a further alternative embodiment showing a printed circuit board 90 formed of a plastic such as LCP V-140 (VECTRA) or AMODEL. Use of plastic to form a printed circuit board allows the board to be molded into any configuration. As shown, passage 99 and bend 85 are molded into the printed circuit board 90 and allows the board 90 to be inserted into many places and in orientations prohibited in the past by the inflexibility of FR4 boards. FIG. 12 shows an enlarged view of a printed circuit board 90 having circuitized area 89 where conductive ink 91 is adhered to the surface of the printed circuit board 90. Traces 92, 93 and 94 of one embodiment were adhered to the printed circuit board 90 by screen printing. This is accomplished by passing an inked roller or squeegee over a template having a positive image of the circuit traces to be printed which forces the conductive ink to be transferred to the substrate. The conductive ink is cured according to the examples below. Cleaning of the conductive ink after curing may also be desired to remove any oxidation layers. Electroplating of traces may also be used.

Conductive trace 92 includes terminal points 86, 87 which provide a point at which the trace 92 is exposed to allow the electrical signal to be transferred to an external source such as a contact point or another printed circuit board. A first terminal 86 and second terminal 87 define a continuous electrical pathway. The conductive ink used in an embodiment was ORMET 1200 (Toranaga Industries). This conductive ink is a silver-free alloy that is sintered at low temperatures yet achieves high electrical conductivity, good solderability and adhesion strength. The conductive ink melts at 190° C. and once it is hardened, it will not melt again until it reaches more than 320° C. The conductive ink will remain solid at solder temperatures of 180° C. The ink's conductivity is approximately $1.7 \times 10^{-5}$ ohm-cm. The use of ORMET 1200 is especially important to provide such high levels of conductivity. Other conductive inks do not provide such conductivity. However, electroplating with copper and nickel also provides high conductivity. Furthermore, solder pads 94 may be applied over the traces 92, 93 and reflowed upon attachment of a device to the board without delamination of the electroplated layers.

Solderability may be increased by increasing surface area of the substrate. In an alternative embodiment of FIG. 12, the surface of printed circuit board 90 has an etch designed into the mold in order to make the surface rough. Other methods such as sandblasting, use of apparatus such as a SOMACA machine, or chemical etching such as applying weak acids may also provide a roughened surface to allow for the ink to adhere more easily and increase solderability. Resistors 94, 94, 94, 94 such as thick film resistors, polymer thick film (PTF) resistors or thin film resistors may also be screened onto the printed circuit board adjacent to the traces of conductive ink 92, 93, 94.

Further, holes 97, 97, 97 are shown which may be plated through-holes which may have pins inserted therein so that contacts may be mounted through the board. In an alternative embodiment, holes 98, 98, 98 may serve as a via or communication bridge 99 from one side of the board to another. In some applications, a circuit board must be dual-sided so that devices on one side of the board may communicate with devices on the other side of the board. The plastic board may be molded having communication bridges 99 or communication bridges 99 may be drilled in the circuit board. Conductive ink is then adhered to the board and is drawn through communication bridge 99 to the other side of the board to traces on the other side providing a communication pathway 99 for the current. Electroplated vias may also provide communication pathways 99.

Figure 13:
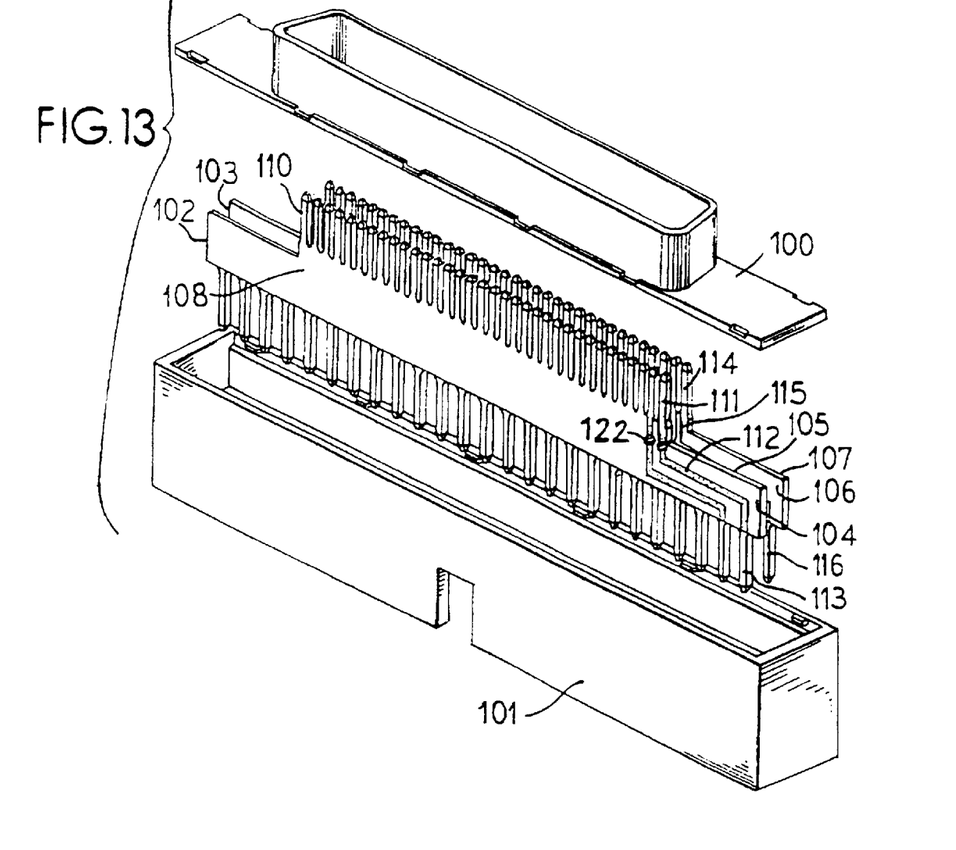
FIG. 13 is an exploded perspective view of a male by male electrical connector.

Such an apparatus and method is necessary for a circuit board but also for the molded contact circuit 30 shown in FIG. 1 and the circuits 102,103 in FIG. 13. The contacts on the first side 46 of the circuit board 30 in some instances must communicate with the second side 47 of the circuit 30 in order that the contacts 31 may communicate between first side 46 and second side 47. Through-holes may be drilled at positions along the traces to provide interconnection for each individual trace and the pair of contacts connected to the trace of conductive ink so that it may communicate with the corresponding pair of contacts and trace of conductive ink on the opposite side of the circuit board.

FIG. 13 discloses a further alternate embodiment showing a male-by-male converter. The conversion of the 68-position connector side to a 50-position connector side is similar to the embodiment shown in FIG. 1. Two rows of male pins protrude through the top housing 100 and two rows of male pins protrude through the bottom housing 101. A further embodiment is shown in this apparatus having plastic molded contacts and a circuit board combined in an integral molded circuit. First molded circuit 102 is arranged parallel to second molded circuit 103 within the housing 101. First molded circuit 102 includes a first side 104 and second side 105. Second molded circuit 103 has a first side 106 and a second side 107. Both molded circuits 102 and 103 include on all sides 104, 105 and 106, 107 a circuitized area 108 in which electrical traces 112 are adhered. In an alternative embodiment, circuitized area 108 may also include active or passive devices connected within the array of traces. FIG. 13 depicts only two sets of traces; however, the entire circuitized area 108 can have traces printed thereon.

The traces 112 end in terminal points coincident with the contact pins 111, 113. First molded circuit 102 includes integrally molded contact pins 110 which have conductive ink adhered to the sides of the pin 110. In some situations only one side of the contact need have conductive ink adhered thereto. However, some applications require dual swipe contacts having conductive ink adhered to both sides of the contact. In such cases, and as shown in the preferred embodiment in FIG. 13, both the first side 104 and the second side 105 of the first molded circuit 102 will have conductive ink adhered at the contact pin 111 and at traces 112 and contact pins 113. In such an embodiment, the contact pins 111, 113 may be dual function by carrying a first signal on trace 112 on first side 104 and a separate second signal on a corresponding trace on the second side 105. Similarly, second molded circuit 103 has conductive ink adhered to first side 106 and second side 107 of the molded circuit 103 at contact pin 114, traces 115 and contact pins 116. In another embodiment, the conductive inks may be substituted for by electroplated metal layers.

Figure 14:
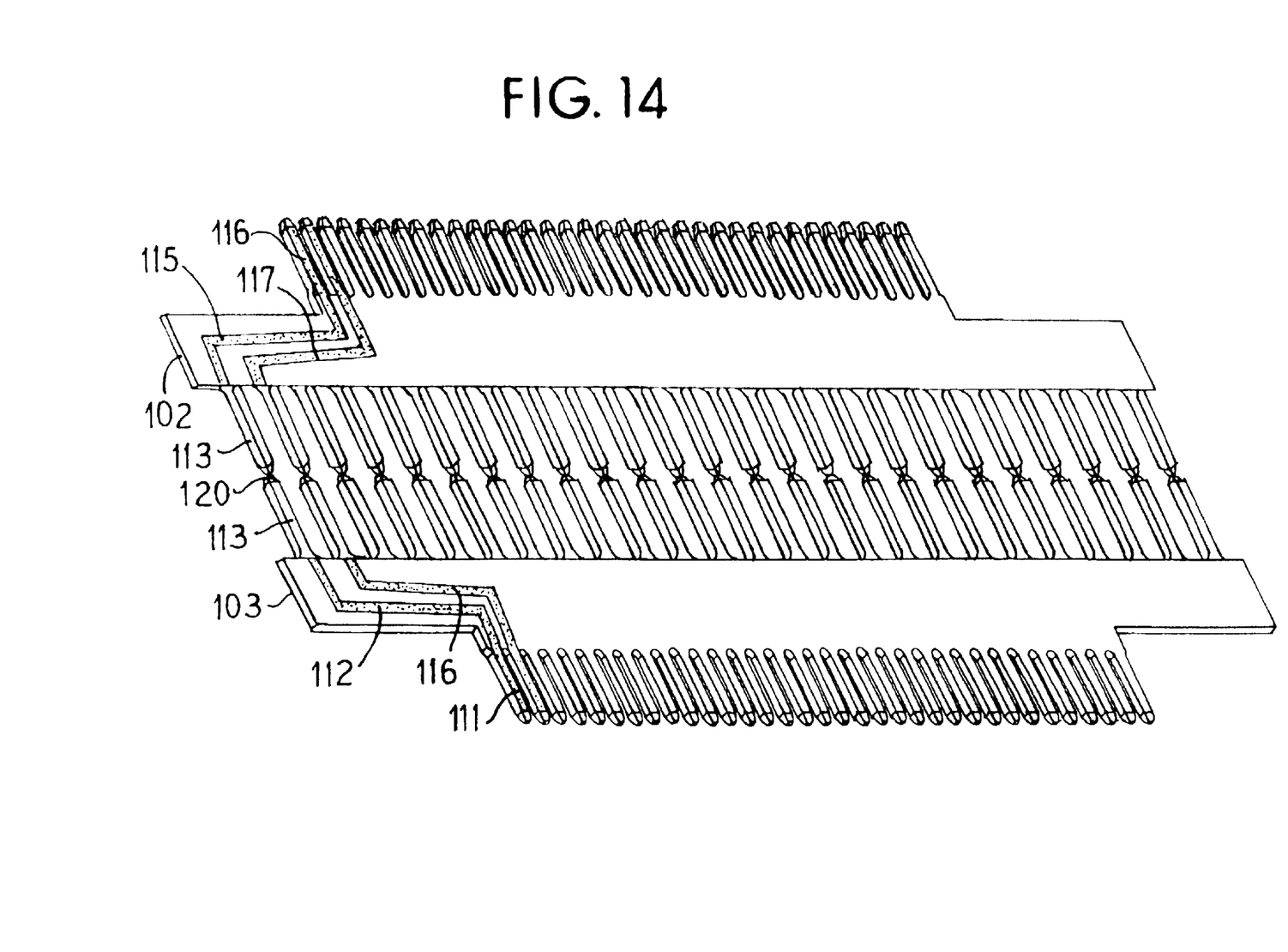
FIG. 14 is a perspective view of the molded circuits of FIG. 13, prior to separation.

The method of applying the conductive ink to the molded circuit is shown in FIG. 14. A method of adhering the conductive ink in a preferred embodiment includes molding the first molded circuit 102 in a one shot process with second molded circuit 103 so that the contact ends meet at a cutting line 120. The conductive traces are adhered to both molded circuits 102 and 103 simultaneously. In a first embodiment, the method of adhering the conductive ink to the substrate is via screen printing. As shown in FIG. 14, traces 112 and 117 are all screened on in one step providing conductive ink adhered to the contact pins 113 and 111 as well as all of the traces therebetween. The molded circuit 102 is then separated from molded circuit 103 along part line 120.

As discussed above, in certain applications, the conductive traces on the first side 104 of the first molded circuit 102 must communicate with the conductive traces on the second side 105 of the first molded circuit 102. A hole is drilled in the molded circuit 102 or some other type of communication bridge may be added prior to adherence of the conductive ink. Upon application of the conductive ink to the first side 104 of the molded circuit 102, the conductive ink fills a communication bridge and contacts the conductive ink of the trace on the second side 105 of the circuit.

In a second embodiment, electroplated metal layers are provided in place of the conductive ink. Screens and masks may be used to selectively electroplate traces 112, 117, and 111, 113.

Further, in some applications, it is necessary that first molded circuit 102 be able to communicate with second molded circuit 103. More specifically, each corresponding pair of contacts 111, 114 must be able to communicate, or carry the same current along the traces. In an alternative embodiment, a communication bridge may be placed between the first and second molded circuits 102, 103 which will connect the traces of the first molded circuit 102 to the corresponding traces of the second molded circuit 103. This may be accomplished in many methods such as ultrasonic welding of the traces or using soldering techniques. Many other configurations may be used in order to have the two molded circuits in communication and these are all contemplated by the present invention.

Figure 15:
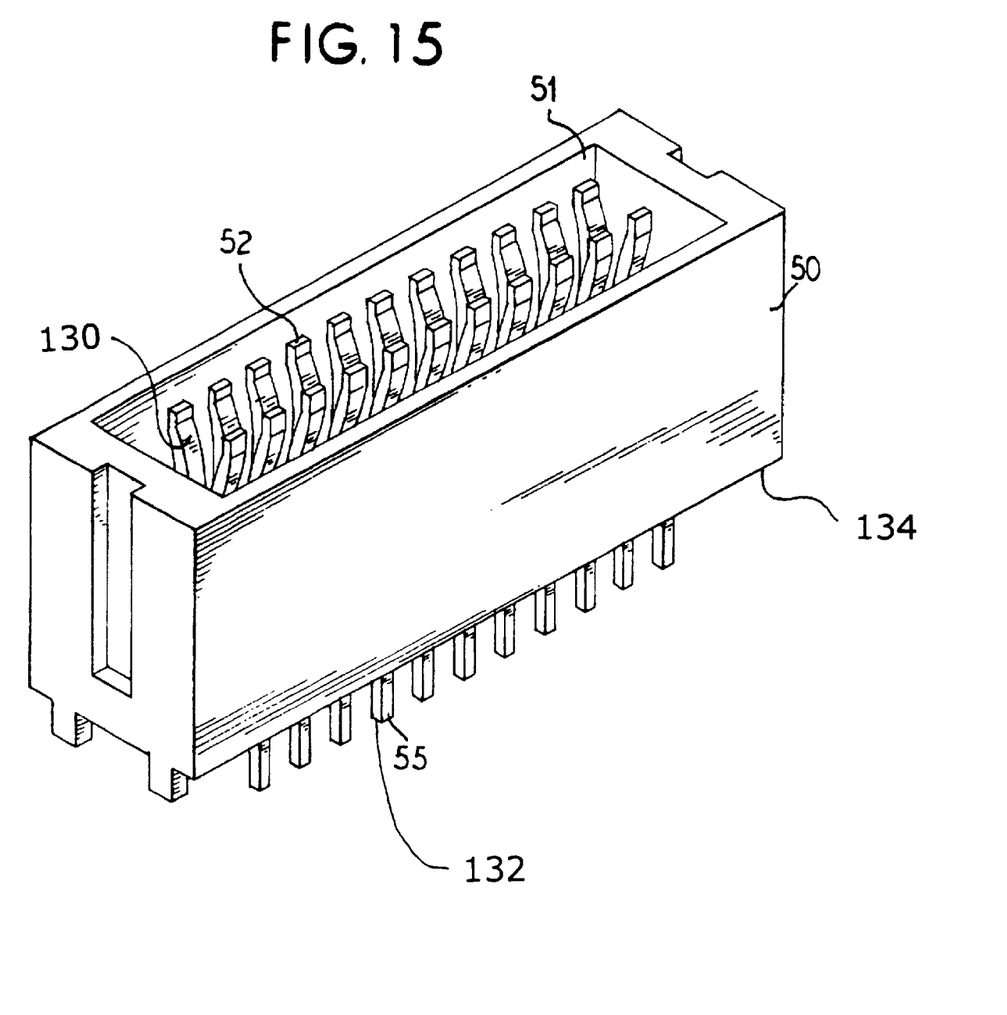
FIG. 15 is a perspective view of an electrical connector where the contacts are metallized.

FIG. 15 is a perspective view of a plurality of contacts 52 positioned within a housing 50. FIG. 15 is similar to FIG. 2. The housing 50 has a top 51 and a bottom 134. The bottom 134 of the housing 50 is positioned near a printed circuit board (PCB). The base material of the contacts 52 is a forty percent mineral-filled, impact-modified polyphthalamide (PPA) resin such as that manufactured by Amoco Polymers, Inc., under the tradename AMODEL AS-1240 EP. The AMODEL resin was chosen for its abilities to be injection molded, to withstand high temperatures, and to be electroplated. The contacts 52, in this embodiment, are electroplated with a thin layer of copper. Then, a thin layer of nickel is electroplated over the copper layer.

Ends 132 of tails 55 of the contacts 52 can then be placed on circuits on the PCB either by resting on the PCB or by having the tail 55 pushed through holes on the PCB. If the ends 132 of the tails 55 of the contacts 52 are set on the PCB, a solder paste is first placed between the ends 132 and the PCB. The entire assembly is then exposed to high temperature, such by vapor phase oven, IR/convection oven, or wave soldering at temperatures between 390–450 degrees fahrenheit, so that the solder flows and bonds to the circuit on the PCB and to the plating on the contacts 52 so as to make electrical continuity between the circuits on the PCB and the plating on the contacts 52. A similar soldering technique is employed if the contacts 52 are pushed through holes in the PCB. As discussed earlier, such a process using metallized ABS resulted in the plating delaminating from the surface of the contact which is unacceptable. The apparatus and method of the preferred embodiment of the invention prevents this problem and allows for soldering processes in excess of 425 degrees fahrenheit without delamination.

Figure 16:
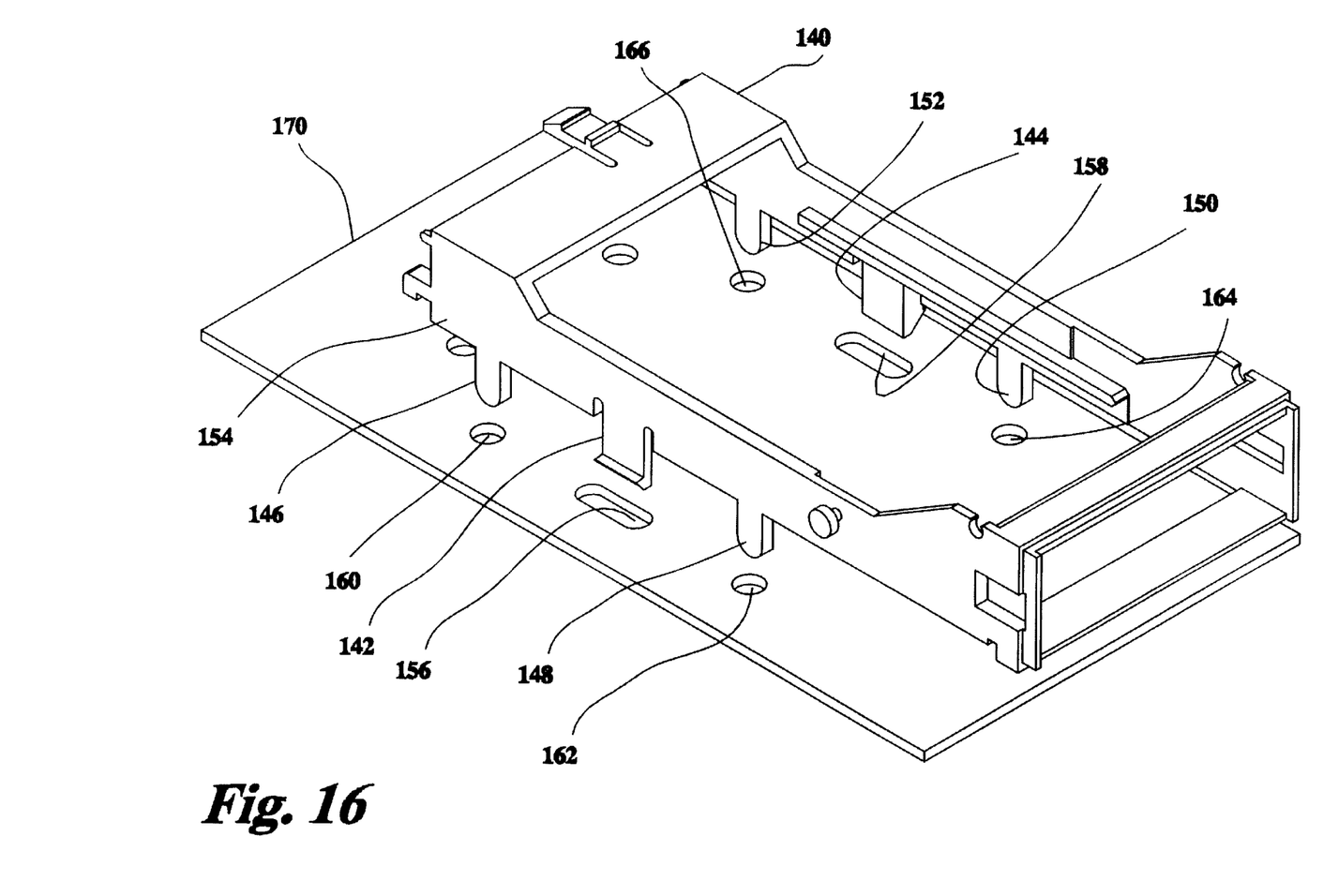
FIG. 16 is an exploded perspective view, taken from a front end, of a GBIC standard guide rail system and a printed circuit board.
Figure 17:
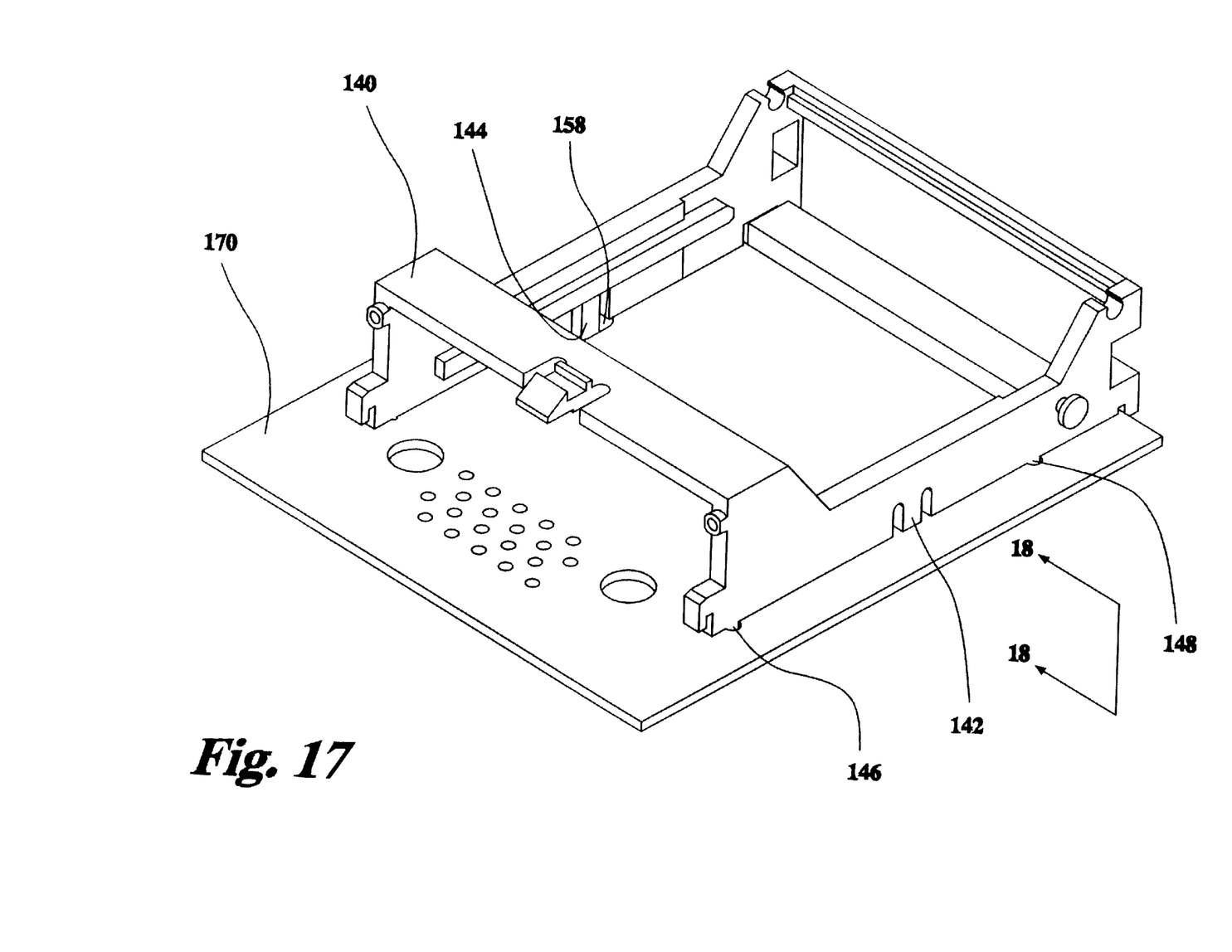
FIG. 17 is a perspective view, taken from a back end, of the GBIC standard guide rail system mounted to the printed circuit board of FIG. 16.
Figure 18:
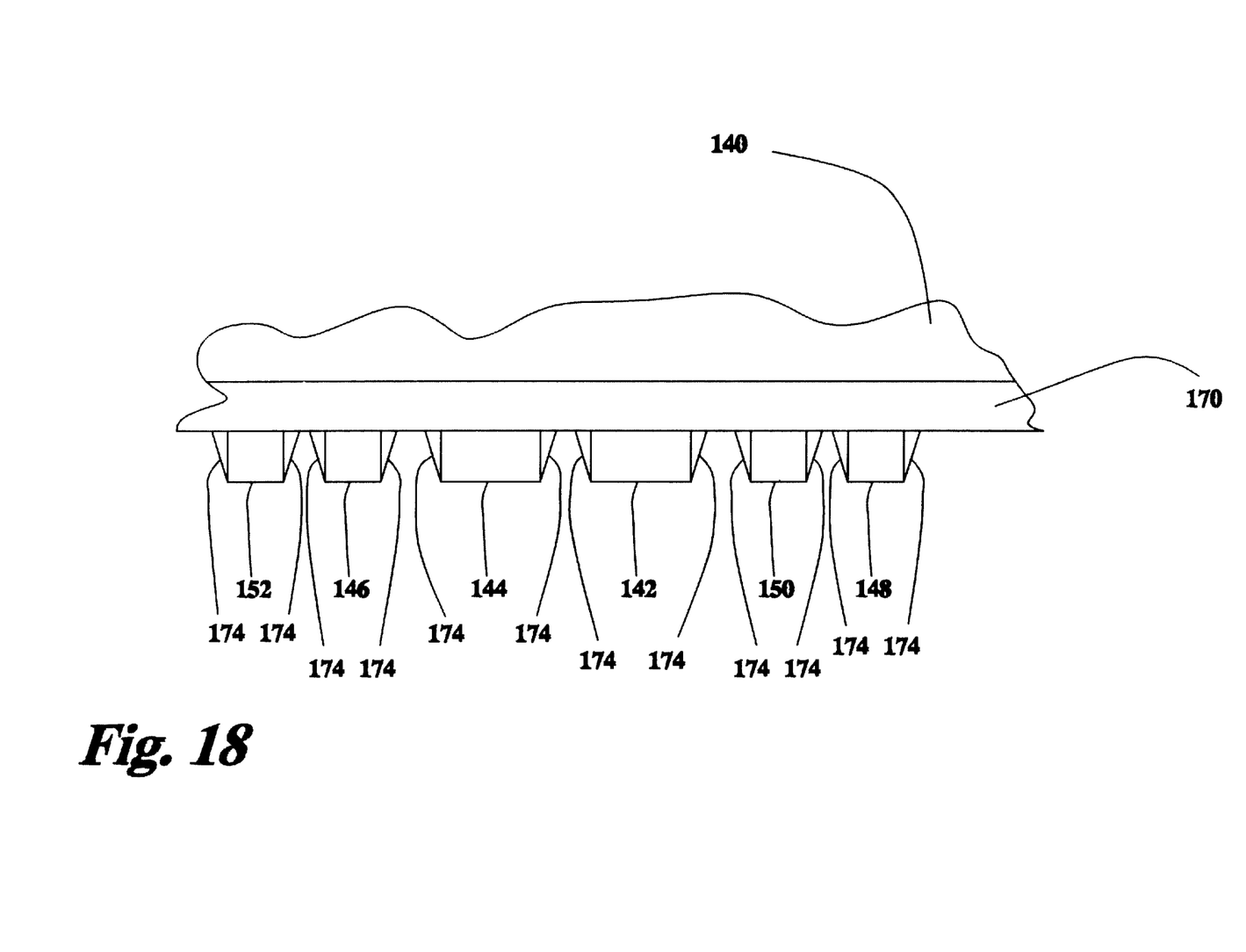
FIG. 18 is a partial side view of the GBIC standard guide rail system attached to the printed circuit board of FIG. 17.

Another embodiment of the invention is shown in FIGS. 16–18. FIG. 16 is an exploded perspective view of the GBIC standard guide rail system 140 and the printed circuit board 170 drawn from the front and side of the device. A GBIC standard guide rail system is a device which accepts a GigaBit Interface Converter (GBIC) as defined by the GBIC specification (Small Form Factor document number: SFF-8053, revision 5.1a), the teaching of which is hereby incorporated herein by reference. The size of the GBIC standard guide rail system 140 and the GBIC standard guide rail system latch slots 156, 158 are prescribed by the document, SFF-8053. In this embodiment, the entire GBIC standard guide rail system is made of AMODEL resin and is then entirely electroplated with a first layer of copper and a second layer of nickel 154. The metallized plastic GBIC standard guide rail system solves the problem of electrically grounding the same as is described below. Latches 142, 144 of a GBIC standard guide rail system 140 fit into GBIC standard guide rail system slots 156, 158 formed in a PCB 170. The distance between two opposing latches 142, 144, in the free state, is greater than the distance between the two opposing latch receiving holes 156, 158 in the PCB 170. Thus, the latches 142, 144 are elastically deformed and snapped into place on the PCB 170. The amount of deformation necessary to fit the latches 142, 144 into the respective slots 156, 158 requires that the GBIC standard guide rail system 140 be made of a polymer. The GBIC standard guide rail system 140 also includes locating or positioning pins 146, 148, 150, and 152 which fit into respective pin receiving holes 160, 162, 164, and 166 formed in the PCB 170.

FIG. 17 is a perspective view of the GBIC standard guide rail system 140 mounted to the PCB 170 taken from the back end of the assembly. In FIG. 17, the latch 142 is fully inserted into slot 156, and latch 144 is fully inserted into slot 158. Furthermore, each pin 146, 148, 150, and 152 are inserted into their respective holes 160, 162, 164, and 166. The GBIC standard guide rail system 140 having a metallic plating 154 is placed in such a position by pressing the GBIC standard guide rail system 140 towards the PCB 170. As the GBIC standard guide rail system 170 is further introduced towards the PCB 170, the latches 142, 144 move towards each other as the latches 142, 144 are introduced into the slots 156, 158. Once the latches 142, 144 are fully introduced into the slots 156, 158 the latches 142, 144 spring back towards their undeflected position once the large portion of each latch passes through the respective hole. In such a position, the GBIC standard guide rail system 140 is probably electrically connected to the PCB 170 and generally may remain as such. However, perhaps some oil, debris, grease, or other substance may accumulate within the slots 156, 158 or holes 160, 162 164, 166, and insulates the conductive latches 142, 144 or pins of the GBIC standard rail system 140 from the PCB 170. Thus, in a preferred embodiment, the latches 142, 144, and pins 146, 148, 150, and 152 are soldered to the PCB 170 so as to ensure the continued existence of the electrical connection between the GBIC standard guide rail system 140 and the PCB 170 throughout the design lifetime of the manufactured product.

FIG. 18 is a partial side view of the GBIC standard guide rail system 140 and the PCB of 170 taken along line 18—18 of FIG. 17. FIG. 17 shows the staggering of the latches 142, 144 and the pins 146, 148, 150, 152 of the GBIC standard guide rail system 140. Each of the latches and pins is shown as having a layer of solder 174 connecting each of them to the PCB 170. The solder 174 acts as a supplemental physical attachment of the GBIC standard guide rail system 140 to the PCB 170, and also ensures the electrical continuity between the GBIC standard guide rail system 140 and the PCB 170. The soldering process creates a temperature of approximately 425 degrees fahrenheit. The use of the plating on the AMODEL resin creates a structure which is flexible, electrically conductive, and solderable. Furthermore, the plating 154 of the GBIC standard guide rail system 140 does not delaminate from the underlying polymer structure after the soldering process. Such a low cost conductive system has not been previously achieved.

As way of background, during use of a GBIC it was determined that it would be useful to electrically ground the GBIC standard guide rail system. One solution was to make the GBIC standard guide rail system out of a die cast metal. Such a solution is not workable since the die cast metal rail system does not deform appreciably and does not fit into GBIC standard guide rail system latch slots. As such, non-standard latch receiving holes must be found in the PCB. Thus, this solution was not acceptable.

Another solution was to metallize the existing GBIC standard guide rail system formed of common low temperature polymers. Such a rail system offers grounding and elastically deforms enough so as to fit into GBIC standard guide rail system latch slots. However, upon soldering the latches to the PCB, the plating delaminated from the surface of the latches. Such delamination is not acceptable since electrical continuity may be lost if the plating tears. Therefore, the embodiment shown in FIGS. 16–18 is elastically flexible, electrically conductive, solderable, and non-delaminating.

Obviously, numerous modifications and variations of the present invention are possible in light of the above teachings. It is therefore to be understood that within the scope of the appended claims, the invention may be practiced otherwise than as specifically described herein.

What is claimed is:

1. A conductive element comprising:

a substrate having a surface, the substrate made of a polymer; and an electrically conductive material covering the surface of the substrate forming an electrically conductive region on the substrate, and wherein the electrically conductive material in the electrically conductive region is solderable, and wherein the electrically conductive material in the electrically conductive region does not delaminate from the surface of the substrate after the electrically conductive material in the electrically conductive region has been soldered, and wherein no delamination occurs when the conductive element is exposed to temperatures between 390 and 450 degrees fahrenheit.

2. A conductive element comprising:

a substrate having a surface, the substrate made of a polymer, the polymer being made of a mineral filled, impact-modified polyphthalamide; and an electrically conductive material electroplated to the surface of the substrate forming an electrically conductive region on the substrate, the electrically conductive material being made of nickel over copper, and wherein the electrically conductive material in the electrically conductive region is solderable, and wherein the electrically conductive material in the electrically conductive region does not delaminate from the surface of the substrate after the electrically conductive material in the electrically conductive region has been soldered, and wherein no delamination occurs when the conductive element is exposed to temperatures between 390 and 450 degrees fahrenheit.

3. The conductive element according to claim 2 wherein the substrate has a shape which conforms to a GBIC standard guide rail system.

4. An assembly comprising:

a GBIC standard guide rail system including a first latch, a second latch, and a surface, the surface covering the GBIC standard guide rail system including the first latch and the second latch, the GBIC standard guide rail system made of a polymer material, the polymer material being made of a mineral filled, impact-modified polyphthalamide;

an electrically conductive material electroplated to the surface of the GBIC standard guide rail system including the first latch and the second latch, the electrically conductive material being made of nickel over copper; and a printed circuit board having at least one electrically conductive circuit, and wherein the electrically conductive material electroplated to the surface of the first latch is soldered to the at least one electrically conductive circuit of the printed circuit board, and wherein the electrically conductive material electroplated to the surface of the first latch does not delaminate from the surface of the first latch after the electrically conductive material has been soldered.

5. A process for plating an element comprising the steps of:

electroplating a surface of the element with an electrically conductive material, the electrically conductive material being made of nickel over copper, and wherein the element being made of a polymer material, the polymer material being made of a mineral filled, impact-modified polyphthalamide; and soldering the electrically conductive material of the element to an electrically conductive body so as to make an electrical connection between the element and the body, and wherein the electrically conductive material electroplated to the surface of the element does not delaminate away from the surface of the element after the step of soldering at temperatures between 390 and 450 degrees Fahrenheit.

6. A process for plating a GBIC standard guide rail system comprising the steps of:

electroplating a surface of the GBIC standard guide rail system with an electrically conductive material, the electrically conductive material being made of nickel over copper, and wherein the GBIC standard guide rail system being made of a polymer material, the polymer material being made of a mineral filled, impact-modified polyphthalamide; and soldering the electrically conductive material of the GBIC standard guide rail system to an electrically conductive body so as to make an electrical connection between the GBIC standard guide rail system and the body, and wherein the electrically conductive material electroplated to the surface of the GBIC standard guide rail system does not delaminate from the surface of the GBIC standard guide rail system after the step of soldering.

7. An assembly comprising:

a GBIC standard guide rail system including a first latch, a second latch, and a surface, the surface covering the GBIC standard guide rail system including the first latch and the second latch;

an electrically conductive material covering the surface of the GBIC standard guide rail system including the first latch and the second latch; and a printed circuit board having at least one electrically conductive circuit, and wherein the electrically conductive material covering the surface of the first latch is soldered to the at least one electrically conductive circuit of the printed circuit board, and wherein the electrically conductive material covering the surface of the first latch does not delaminate from the surface of the first latch after the electrically conductive material has been soldered.

* * * * *